United States Patent
Grodzki et al.

(10) Patent No.: US 9,632,160 B2
(45) Date of Patent: Apr. 25, 2017

(54) DETERMINATION OF A PULSE SEQUENCE FOR A MAGNETIC RESONANCE SYSTEM

(71) Applicants: David Grodzki, Erlangen (DE); Bjoern Heismann, Erlangen (DE)

(72) Inventors: David Grodzki, Erlangen (DE); Bjoern Heismann, Erlangen (DE)

(73) Assignee: Siemens Aktiengesellschaft, Munich (DE)

( * ) Notice: Subject to any disclaimer, the term of this patent is extended or adjusted under 35 U.S.C. 154(b) by 582 days.

(21) Appl. No.: 14/182,538

(22) Filed: Feb. 18, 2014

(65) Prior Publication Data

US 2014/0232397 A1 Aug. 21, 2014

(30) Foreign Application Priority Data

Feb. 18, 2013 (DE) .................... 10 2013 202 548

(51) Int. Cl.
*G01R 33/48* (2006.01)
*G01R 33/54* (2006.01)

(52) U.S. Cl.
CPC ......... *G01R 33/543* (2013.01); *G01R 33/482* (2013.01); *G01R 33/4824* (2013.01)

(58) Field of Classification Search
CPC . G01R 33/543; G01R 33/4824; G01R 33/482
See application file for complete search history.

(56) References Cited

U.S. PATENT DOCUMENTS

| | | | |
|---|---|---|---|
| 2003/0191386 A1* | 10/2003 | Heid | G01R 33/54 600/410 |
| 2008/0024129 A1 | 1/2008 | Heid | |
| 2008/0315877 A1* | 12/2008 | Osman | A61B 5/055 324/309 |
| 2010/0052678 A1 | 3/2010 | Heid et al. | |
| 2010/0090694 A1 | 4/2010 | Heid et al. | |
| 2012/0194185 A1 | 8/2012 | Ritter | |
| 2012/0262171 A1 | 10/2012 | Weber et al. | |

* cited by examiner

*Primary Examiner* — G. M. Hyder
(74) *Attorney, Agent, or Firm* — Schiff Hardin LLP

(57) ABSTRACT

In a method and a pulse sequence determination device to determine a pulse sequence for a magnetic resonance system, control protocol parameter values are initially acquired. A determination of k-space trajectory node points within k-space then takes place in a processor on the basis of the control protocol parameter values. The determination of the pulse sequence then takes place on the basis of the k-space trajectory node points. A method for operating a magnetic resonance system uses such a pulse sequence, and a magnetic resonance system embodies such a pulse sequence determination device.

12 Claims, 5 Drawing Sheets

DETERMINATION OF A PULSE SEQUENCE FOR A MAGNETIC RESONANCE SYSTEM

BACKGROUND OF THE INVENTION

Field of the Invention

The invention concerns a method and a pulse sequence determination device to determine a pulse sequence for a magnetic resonance system. Moreover, the invention concerns a method to operate a magnetic resonance system using such a pulse sequence, as well as a magnetic resonance system with a radio-frequency transmission device that is designed in order to emit a radio-frequency pulse train to implement a desired measurement on the basis of a predetermined pulse sequence, and to emit a gradient pulse train via the gradient system, in coordination with the emission of the radio-frequency pulse train.

Description of the Prior Art

In a magnetic resonance system also called a magnetic resonance tomography system, the body to be examined is typically exposed to a relatively high basic magnetic field (for example of 1, 5, 3 or 7 Tesla) with the use of a basic field magnet system. A magnetic field gradient is additionally applied by a gradient system. By means of suitable antenna devices, radio-frequency excitation signals (RF signals) are then emitted via a radio-frequency transmission system. The radio-frequency excitation signals are designed to cause the nuclear spins of specific atoms to be excited to resonance by the radio-frequency field, so as to be flipped (deflected) by a defined flip angle relative to the magnetic field lines of the basic magnetic field. Upon relaxation of the nuclear spins, radio-frequency signals known as magnetic resonance signals, are radiated by the excited nuclear spins, and are received by means of suitable reception antennas and then processed further. Finally, the desired image data can be reconstructed from the raw data acquired in such a manner.

For a specific measurement, a pulse sequence is to be emitted with a radio-frequency pulse train to be emitted and a gradient pulse train to be switched in coordination with this (with matching gradient pulses in the slice selection direction, in the phase coding direction and in the readout direction, frequently in the x-direction, y-direction and z-direction). In particular, the timing within the sequence—i.e. at which time intervals which pulses follow one another—is thereby significant to the imaging. A number of control parameter values is normally defined in what is known as a measurement protocol, which is created beforehand and can be retrieved (for example from a memory) for a specific measurement and can possibly be modified by the operator on site, which operator can provide additional control parameter values (for example a defined slice interval of a stack of slices to be measured, a slice thickness etc.). A pulse sequence is then calculated on the basis of all of these control parameter values, which pulse sequence is also designated as a measurement sequence, MR sequence (magnetic resonance sequence), or shortened to just sequence.

The readout processes of the magnetic resonance signals—i.e. the acquisition of raw data—are defined just like the emission of the radio-frequency signals in what is known as "k-space". Arbitrary points in k-space can be approached via appropriate switching (activation) of the gradients. K-space is the positional frequency domain, and a trajectory in k-space (also called a "k-space trajectory" or shortened to "trajectory" in the following) describes the path for the entry of data into k-space that is chronologically traversed given emission of an RF pulse or given readout via corresponding switching of the gradient pulses. During a resonance measurement, k-space is filled with raw data by traveling defined k-space trajectories during the raw data acquisition, and the image data are then reconstructed from these raw data via a Fourier transformation.

In order to fill k-space, different patterns are traversed—for example Cartesian patterns, in which individual routes of the k-space trajectory are traveled line-by-line (for example), but also spoke-like or spiral-shaped patterns. This depends on the respective sequence type, among other things.

Such pulse sequences are typically crated by special sequence programmers. The creation is thereby based on the precise definition or, respectively, implementation of the individual gradient curves, wherein the precise timing and the shape and strength of the individual gradient pulses is provided by the sequence programmer depending on the sequence type. It has been necessary for the programming of the sequence to conventionally take place very close to hardware, meaning that it is dependent on the respective type of the magnetic resonance system on which the MR sequence should run. This method is therefore relatively complicated, and requires highly specialized programmers and normally special, apparatus-dependent programming tools.

SUMMARY OF THE INVENTION

An object of the present invention is to provide a method to determine a pulse sequence for a magnetic resonance system, and a pulse sequence determination device that is suitable for this purpose which enables a generation of pulse sequences with less effort.

In the method according to the invention, control protocol parameter values are initially recorded. For example, these are hereby the values of parameters that are typically defined in a control protocol. Among these are—for example—the sequence type, i.e. whether it is an EPI (echoplanar imaging) sequence, a TSE (turbo spin echo) sequence, for example, and whether it is a Cartesian sequence, a radial sequence or a spiral sequence. Additional typical control protocol parameters are the echo time, the repetition time, the resolution and the readout bandwidth, which predetermines the readout speed. However, the target magnetization etc. can similarly also be adopted as a control protocol parameter.

According to the invention, k-space trajectory node points (also shortened to just node points in the following) within k-space are then determined on the basis of the control protocol parameter values. This means that which individual node points or fixed points within k-space are to be activated in succession during the readout of the pulse sequence is established. The k-space coordinates (for example in the x-, y-, z-direction) and the function of the node point (for example whether it is a start point or end point of a readout path etc.) can thereby be established for every k-space trajectory node point. Thus, the specification of the node points also corresponds to a definition of the readout regions or readout window. The indication or determination of the k-space trajectory node points can also take place indirectly via a path determination between the points, meaning that only a first start point is specified and then a length and direction of the path starting from there up to the end point of this path (which is then the start point for the next path). The determination of the pulse sequence then subsequently takes place on the basis of the designated k-space trajectory node points.

In the method according to the invention, the start points in time and the duration (i.e. the timing) and the shape of the individual pulses are not initially predetermined (which is different than in the previous approaches); rather, a definition of the points in k-space that are to be approached and their function takes place first.

An automatic determination of the k-space node points can hereby take place on the basis of the control parameter values in that specific rules are used (which rules are stored in a database, for example). In particular, it is possible to store special, sequence type-specific rules for every sequence type, for example the order of inversion pulses in the TSE sequence or the order of the spoilers in the GRE (gradient echo) sequence.

If the k-space trajectory node points are first established once, it is thus relatively simple to then also automatically determine or, respectively, calculate the pulse sequence based on these, as this is explained further later using examples. Defined rules (which can be stored in a database, for example) can also be used to calculate the pulse sequence. For example, which gradient moment is necessary in order to arrive from one node point to the next can thus be determined in a simple manner directly from the interval of two node points specified in Cartesian coordinates in k-space. If it is further established (as explained later) in what time period the path from one node point to the next node point must be traversed, a suitable gradient pulse can be calculated automatically in order to traverse this path as desired. The timing for the individual pulses inevitably then also results from this, without this needing to be established in detail beforehand by the programmer. The gradient pulses are thereby defined in the typical manner via their gradient amplitude, the gradient pulse duration, and via the edge steepness dG/dt of the gradient pulses (also typically designated as "slew rate").

The method according to the invention consequently facilitates the sequence programming such that this can be implemented not only by highly specialized programmers of the magnetic resonance tomography system manufacturer, but possibly also by operators at the users of such systems. This enables a significantly greater flexibility of use.

An additional advantage is that—by establishing the k-space trajectory node points—it is ensured on the one hand that k-space is scanned in the desired manner, but on the other hand that only the absolutely necessary parameter values and time specifications (and not gradient pulses) must thereby be established in detail. Instead of this, the gradient pulses or gradient curves can be generated automatically with suitable optimization methods, and can thereby be optimized with regard to a noise reduction and as little heat emission as possible. It is therefore no longer necessary to modify the gradient pulses (for example in the subsequent optimization methods) so that the noises and the heating are reduced, which' is different than in previous production methods in which the shape and precise timing of the gradient pulses is predetermined by the sequence programmers.

A pulse sequence determination device according to the invention has an input interface arrangement to receive control protocol parameter values. This input interface arrangement can by an arrangement of multiple different interfaces respectively for different data types, or only a single interface that is able to accept multiple data types. As used herein, a receipt of the control protocol parameter values means a receipt of the appertaining data from other components of the magnetic resonance system, for example via a user interface or from a memory unit with a database etc.

Furthermore, the pulse sequence determination device requires a trajectory node point determination unit in order to determine k-space trajectory node points within k-space on the basis of the control protocol parameter values as described above, as well as a pulse sequence determination unit that is coupled with said trajectory node point determination unit, which pulse sequence determination unit then determines or, respectively, calculates the pulse sequence on the basis of the k-space trajectory node points.

Moreover, the pulse sequence determination device normally also has a suitable pulse sequence output interface in order to pass the pulse sequence to other control units of the magnetic resonance tomography system, for example in order to therefore directly control the subsequent measurement or in order to send the pulse sequence via a network and/or store it in a memory for later use.

In a method according to the invention for the operation of a magnetic resonance system, according to the method described in the preceding a pulse sequence is determined and then the magnetic resonance system is operated using this pulse sequence. A magnetic resonance system of the aforementioned type according to the invention accordingly has a pulse sequence determination device as described in the preceding.

Significant portions of the pulse sequence determination device can be fashioned in the form of software components. This relates to the trajectory node point determination unit and the pulse sequence determination unit. The cited interfaces can likewise be fashioned at least in part in the form of software and can possibly access hardware interfaces of a present computer. The invention thus also includes a non-transitory, computer-readable data storage medium encoded with programming instructions that can be loaded directly into a memory of a pulse sequence determination device, with program code segments in order to execute all steps of the method according to the invention when said programming instructions are executed in the pulse sequence determination device. Such a realization in software has the advantage that previous devices that are used to determine pulse sequences can also be suitably modified via implementation of the program in order to quickly and robustly optimize pulse sequences in the manner according to the invention.

As was explained above, a pulse sequence includes not only gradient pulses or the switching of gradients that are required in order to take up the various points in k-space, but rather also an RF pulse series that is to be emitted in coordination with said gradient pulses, as well as matching readout windows that are to be set (meaning an activation or, respectively, deactivation of corresponding readout electronics, for example of ADCs (analog/digital converters) connected to the coils).

Therefore, defined events are preferably associated with at least some of the k-space trajectory node points. For example, such events can be radio-frequency pulse events, i.e. whether a defined radio-frequency pulse (for example an excitation pulse or a refocusing pulse, for example) is emitted when the associated k-space trajectory node point is reached, for example. Depending on the node point and radio-frequency pulse, it can thereby also be the case that the emission of a radio-frequency pulse leads to a change of the position in k-space, for example in that the algebraic sign of a coordinate in k-space is changed by flipping the spins by 180°.

A further possibility to link k-space trajectory node points with events is an association of readout events, wherein what is understood by this is an association of the readiness of readout electronics to receive during a path between two k-space trajectory node points, whereby it is then established that raw data are acquired on this path.

In addition, however, there can also be k-space node points that must be traversed or reached on the path to other k-space node points, meaning that no additional actions are implemented at these node points or in the path course between these node points; rather, only defined gradients are set, for example, in order to approach the appertaining node point in k-space or in order to set a defined additional gradient moment which is required to implement the pulse sequence. The gradient pulse moment (also called a gradient moment) is defined by the integral of the amplitude of the gradient pulse over time.

For this purpose, auxiliary gradient moments that are required within the pulse sequence depending on a sequence type are advantageously determined automatically within the method according to the invention. The further determination of the pulse sequence then takes place under consideration of these auxiliary gradient moments. In a number of pulse sequences that are frequently used in clinical magnetic resonance tomography—for example given spin echo sequences (SE sequences) or given TSE sequences—gradient pulses known as gradient spoiler pulses (shortened to "spoilers") are executed in addition to the gradient pulses that are necessary for spatial coding. Gradient spoiler pulses (also called gradient crusher pulses (shortened to "crushers")) in some cases, particularly if they occur in pairs) are executed by the same gradient coils immediately before and/or after the actual gradient pulses used for spatial coding, and ensure that unwanted free induction decay (FID) are suppressed, for example. In order that they suppress the FID signals with certainty, the spoilers or crushers must have a defined spoiler or crusher moment. Such spoilers or crushers are a typical example of auxiliary gradient moments. Moreover, however, there are also defined auxiliary gradient moments that ensure that defined contrasts can be achieved, such, a diffusion gradient pulses or flow compensation gradients.

In a preferred embodiment of the method according to the invention, system specification parameter values are received (for example from a memory), in particular are read out from a database in which the parameter values are stored for various systems or for the concrete system for which the pulse sequence should be created. The determination of the pulse sequence then takes place under consideration of these system specification parameter values. For example, these parameter values are limit values that should not be exceeded or fallen below at the respective system. For example, typical values for these are a maximum allowed gradient amplitude or a maximum edge steepness.

During a pulse sequence, the process inevitably switches frequently between the magnetic gradient coils via which the gradient pulses are emitted. Eddy currents with other components of the magnetic resonance tomograph (in particular the radio-frequency shield) are one reason for the known noise development during the switching of the gradients. In particular, a high edge steepness contributes to the noise exposure. The rapidly changing gradient fields lead to distortions and oscillations in the gradient coils and to the transmission of these energies to the housing. Steep edges therefore also lead to a high power consumption, and additional place greater demands on the hardware.

For this reason, in most systems both the slew rate and the maximum allowed amplitude are limited. For example, the system specification parameter values can be introduced as boundary conditions within a determination method or optimization method in which the pulse sequence is calculated so that the k-space trajectory node points are respectively reached. Pulse sequences are thus generated that could then not be emitted at the respective system since the system specification parameter values are not complied with.

The following steps are preferably implemented to determine the pulse sequence on the basis of the k-space trajectory node points:

A determination of node point times associated with the k-space trajectory node points initially takes place on the basis of at least one of the control protocol parameter values. This means that a calculation is made as to when certain node points must be reached. For example, this depends on the readout bandwidth, the resolution, the echo time or, respectively, the echo interval and the repetition time. The node point times are relative points in time with regard to the start point in time of the pulse sequence.

A determination or calculation then takes place of the k-space trajectories and the precise curves of the gradient pulse series in the various spatial directions in order to reach these node point times associated with these k-space trajectory node points. This means that an optimized gradient pulse series is calculated on the basis of the points in time and the k-space trajectories which travel between the k-space trajectory node points.

For example, for this purpose the node point times associated with the k-space trajectory node points can be indicated as fixed points in time on a time axis for the gradient curve. The current gradient amplitude at the respective point in time can then also be calculated for these fixed points (wherein these can be positive, negative or also zero). In addition to this, if the required gradient moment between adjacent k-space trajectory node points or, respectively, these fixed points in time is known, this can be used as boundary conditions in an optimization method in order to determine the gradient shape along the time axis. For example, a spline optimization method is suitable for this, preferably a spline optimization method to the 4th power (of the 4th order).

If the curves of the gradient pulse series are known, the exact time specification parameters for the radio-frequency pulses and the readout time periods (in which a reception device must be switched so as to be ready for readout) that are to be set in parallel or in coordination can additionally also be established between the respective points in time, or at the respective points in time.

The method is preferably implemented so that an operator still has opportunities to modify specific parameter values (in particular for the control protocol parameters) for the respective examination. In order to enable this, in a preferred further development the following additional method steps are advantageously initially implemented after the determination of the k-space trajectory node points:

a) A determination or calculation of possible minimum node point times to achieve the k-space trajectory node points initially takes place. This means that a check is made as to when, in principle, which node points can be achieved in which time period. This calculation can take place on the basis of the distances between the k-space trajectory node points, and advantageously under consideration of the aforementioned system specification parameter values. For example, over which time period which amplitude must be present in order to reach one k-space node point from a previous k-space trajectory node point—for example if the gradient amplitude and the slew rates are just below the allowed limit values—can thereby be calculated simply based on the path and the gradient moment required for this.

b) A determination of adjustable or allowed parameter regions for at least some control protocol parameters then initially takes place. For example, in which range an echo time or a repetition time can still possibly be varied, or in which ranges the resolution or the readout bandwidth can still be adjusted by the operator, can be calculated.

c) An output or display of the allowed parameter value ranges or their limits, and detection of parameter value selection commands can then subsequently take place. This means that it is displayed to the operator that, for example, he or she can select a new echo time between a minimum and maximum echo time. The operator can then enter a parameter value change command to change control protocol parameter values, this command being detected via a corresponding interface.

d) A check of the possible minimum node point times, as to whether these are still supportable given variation of the parameter values, then takes place in an additional step, and there are then two possibilities depending on the result of this check:

If it is established that the possible minimum node point times cannot be achieved with the new parameter values, either new k-space trajectory node points can be determined on the basis of the control protocol parameter values and the modified parameter values, and the steps a) through d) can then subsequently be traversed.

Otherwise, if it turns out that the minimum node point times can also be complied with given the modified parameter values, the determination or calculation of the pulse sequence on the basis of the k-space trajectory node points can be continued in that (as explained above) the k-space trajectories and the curves of the gradient pulse shape are calculated, and the exact time specification parameter values can subsequently be determined for the radio-frequency pulses and the readout time periods.

Moreover, it is advantageously also possible for the operator not only to select the parameter values within the allowable parameter ranges with the use of the parameter value selection commands and to vary the control protocol parameter values (which are predetermined by the control protocol) in the allowable limits; but also for the user to directly establish the same k-space trajectory node points or readout regions in k-space that are defined by the k-space trajectory node points. For this purpose, the pulse sequence determination device or the trajectory node point determination unit must merely have a suitable user interface in order to register corresponding k-space trajectory node points from the user.

As was noted above, it has previously been typical for the sequences to be created by special system-specific programming tools.

In the method according to the invention, the k-space trajectory node points and/or the pulse sequence (possibly including the auxiliary moments) are advantageously determined or defined using an apparatus-independent programming language. The determination or definition of the k-space trajectory node points and/or of the pulse sequence (possibly including the auxiliary moments) preferably takes place using a scripting language. In other words, the trajectory node point determination unit and/or the pulse sequence determination unit can be realized via an apparatus-independent programming language (in particular a scripting language). This has the advantage that less experienced programmers (for example on site at a clinic) can also still modify the automatic method to determine the k-space trajectory node points or to determine the pulse sequence, wherein no system-specific knowledge is required. Such a script-controlled definition of k-space trajectories, for example with prior pre-pulses, radio-frequency signals and radio-frequency readout cycles, crushers, etc. that are switched in parallel or succession, thus facilitates the sequence programming not only internally at the system manufacturer, but also at their customers or, respectively, later users of the systems.

DESCRIPTION OF THE PREFERRED EMBODIMENTS

Figure 1:
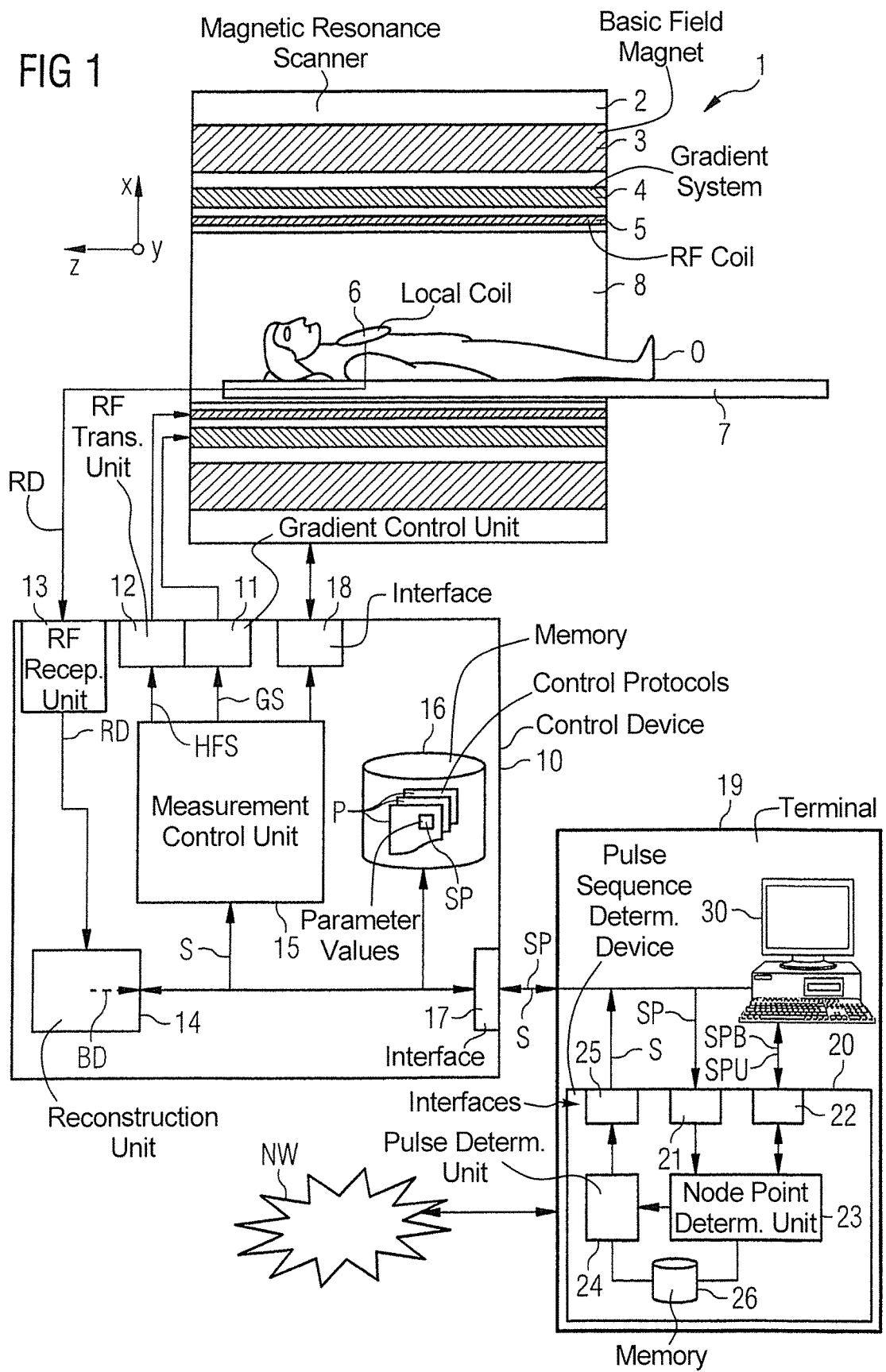
FIG. 1 is a schematic representation of an exemplary embodiment of a magnetic resonance system according to the invention.

A magnetic resonance system 1 according to the invention is schematically depicted in FIG. 1. The system includes the actual magnetic resonance scanner 2 with an examination space or patient tunnel 8 located therein. A bed 7 can be driven into this patient tunnel 8 so that a patient O or test subject lying thereupon during an examination can be borne at a defined position within the magnetic resonance scanner 2 relative to the magnet system and radio-frequency system arranged therein, or can also be moved between different positions during a measurement.

Basic components of the magnetic resonance scanner 2 are a basic field magnet 3, a gradient system 4 with magnetic field gradient coils to generate magnetic field gradients in x-, y- and z-direction, and a whole-body radio-frequency coil 5. The magnetic field gradient coils in the x-, y- and z-direction are controllable independently of one another so that gradients can be applied in arbitrary logical spatial directions (for example in the slice selection direction, in the phase coding direction or in the readout direction) via a predetermined combination, where these directions normally depend on the selected slice orientation. The reception of magnetic resonance signals induced in the examination subject O can take place via the whole-body coil 5 with which the radio-frequency signals for induction of the magnetic resonance signals are normally also emitted. However, these signals are typically received with a local coil arrangement 6 with local coils (of which only one is shown here) placed on or below the patient O. All of these components are known in principle to those skilled in the art and therefore are only schematically shown in FIG. 1.

The components of the magnetic resonance scanner 2 are controllable by a control device 10. It can thereby be a control computer which can be composed of multiple individual computers (which are possibly also spatially separated and connected among one another via suitable cables or the like). Via a terminal interface 17, this control device 10 is connected with a terminal 19 via which an operator can control the entire system 1. In the present case, this terminal 19 is equipped as a computer with keyboard; one or more monitors; and additional input devices (for example mouse or the like), such that a graphical user interface is provided to the operator.

Among other things, the control device 10 has a gradient control unit 11 that can include multiple sub-components. The individual gradient coils are fed via this gradient control unit 11 with control signals according to a gradient pulse sequence GS. As described above, these are hereby gradient pulses that are placed at precisely provided time positions and with a precisely predetermined chronological progression during a measurement.

Moreover, the control device 10 has a radio-frequency transmission unit 12 in order to feed respective radio-frequency pulses into the whole-body radio-frequency coil 5 according to a predetermined radio-frequency pulse sequence RFS of the pulse sequence S. The radio-frequency pulse sequence RFS includes the aforementioned excitation and refocusing pulses. The reception of the magnetic resonance signals then occurs with the use of the local coil arrangement 6, and the raw data RD received therefrom are read out and processed by an RF reception unit 13. The magnetic resonance signals are passed in digital form as raw data RD to a reconstruction unit 14 that reconstructs the image data BD from these and stores these in a memory 16 and/or passes them to the terminal 20 via the interface 17 so that the operator can view them. The image data BD can also be stored at different locations via a network NW and/or be displayed and evaluated. Alternatively, a radio-frequency pulse sequence can also be emitted via the local coil arrangement and/or the magnetic resonance signals can be received by the whole-body radio-frequency coil (not shown).

Via an additional interface 18, control commands are transmitted to other components of the magnetic resonance scanner 2 (for example the bed 7 or the basic field magnet 3), or measurement values or other information are adopted.

The gradient control unit 11, the RF transmission unit 12 and the RF reception unit 13 are respectively controlled in coordination by a measurement control unit 15. Via corresponding commands, this ensures that the desired gradient pulse sequence GS (i.e. the series of gradient pulses) and radio-frequency pulse sequence RFS of the pulse sequence are emitted. Moreover, it must be ensured that the magnetic resonance signals at the local coils of the local coil arrangement 6 are read out and processed further by the RF reception unit 13 at the matching point in time, meaning that readout windows must be set, for example in that the ADCs of the RF reception unit 13 are switched to receive. The measurement control unit 15 likewise controls the interface 18.

However, the fundamental workflow of such a magnetic resonance measurement and the cited components for control are known to the man skilled in the art, such that here they do not need to be further addressed in detail. Moreover, such a magnetic resonance scanner 2 as well as the associated control device can still have a plurality of additional components that here are likewise not explained in detail. At this point it is noted that the magnetic resonance scanner 2 can also be of different design, for example with a laterally open patient space, or can be designed as a smaller scanner in which only one body part can be positioned.

In order to start a measurement, via the terminal 19 an operator can typically select a control protocol P provided for this measurement from a memory 16 in which are stored a plurality of control protocols P for different measurements. This control protocol P includes, among other things, various control protocol parameter values SP for the respective measurement. Among these control protocol parameter values SP are, for example, the sequence type; the magnetization to be achieved via the individual radio-frequency pulses; slice thicknesses, slice intervals, resolution, number of slices, echo times; repetition times etc.

Moreover, instead of retrieving control protocol from memory 16, the operator can also retrieve control protocols with corresponding control protocol parameter values SP via a network NW (for example from a manufacturer of the magnetic resonance system) and then use these as described in the following.

A pulse sequence S is then determined based on the control protocol parameter values SP including the selected time parameters, according to which pulse sequence S the control of the remaining components ultimately takes place via the measurement control unit 15. The pulse sequence S is calculated here in a pulse sequence determination device 20 that is depicted as part of the terminal 19. The precise functionality of the pulse sequence determination device 20 and its individual components is explained further in the following with reference to FIG. 2.

In a first Step I, the control protocol parameter values SP of a selected protocol P (which, in this context, can also be viewed as a default protocol for a defined pulse sequence type or, respectively, a defined examination) are initially loaded in a first Step I. For example, this adoption of the control protocol parameter values SP takes place via an input interface arrangement 21.

In a further Step II, the individual k-space trajectory node points in k-space are then calculated. As described above, the precise position and number of these node points in k-space results from the selected sequence type and the echo and repetition times, the readout and pulse bandwidths, the echo cycles, and additional gradient moments or, respectively, pre-pulses.

Figure 3:
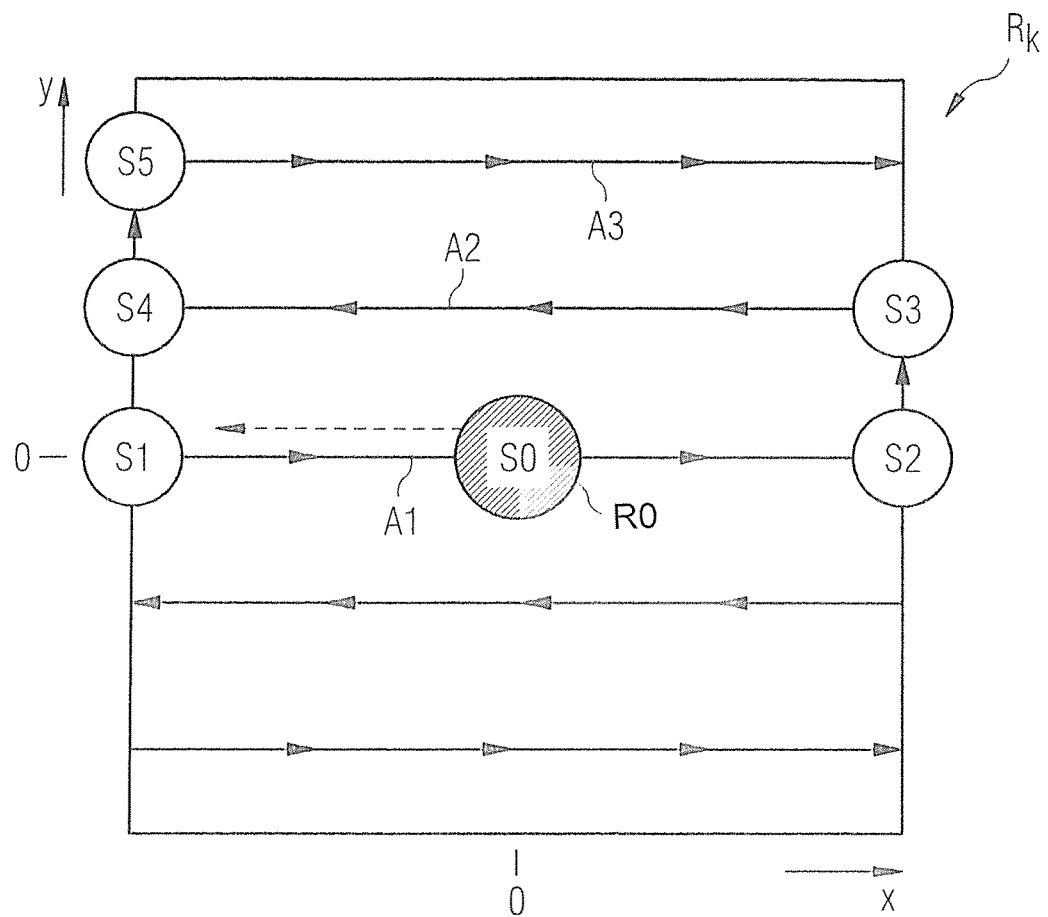
FIG. 3 schematically depicts k-space trajectory node points and k-space trajectories for an EPI sequence, FIG. 4 schematically depicts k-space trajectory node points and k-space trajectories for Cartesian TSE sequence.
Figure 4:
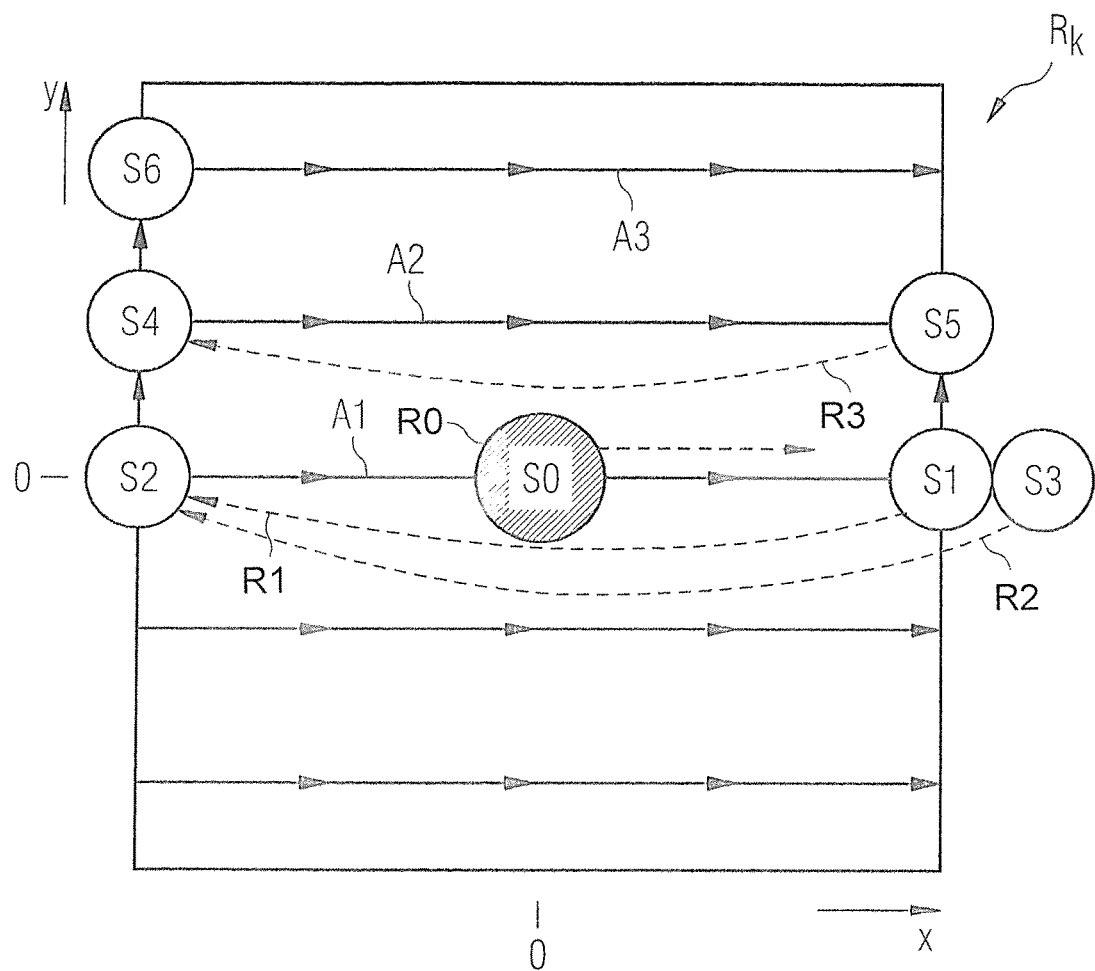
Figure 5:
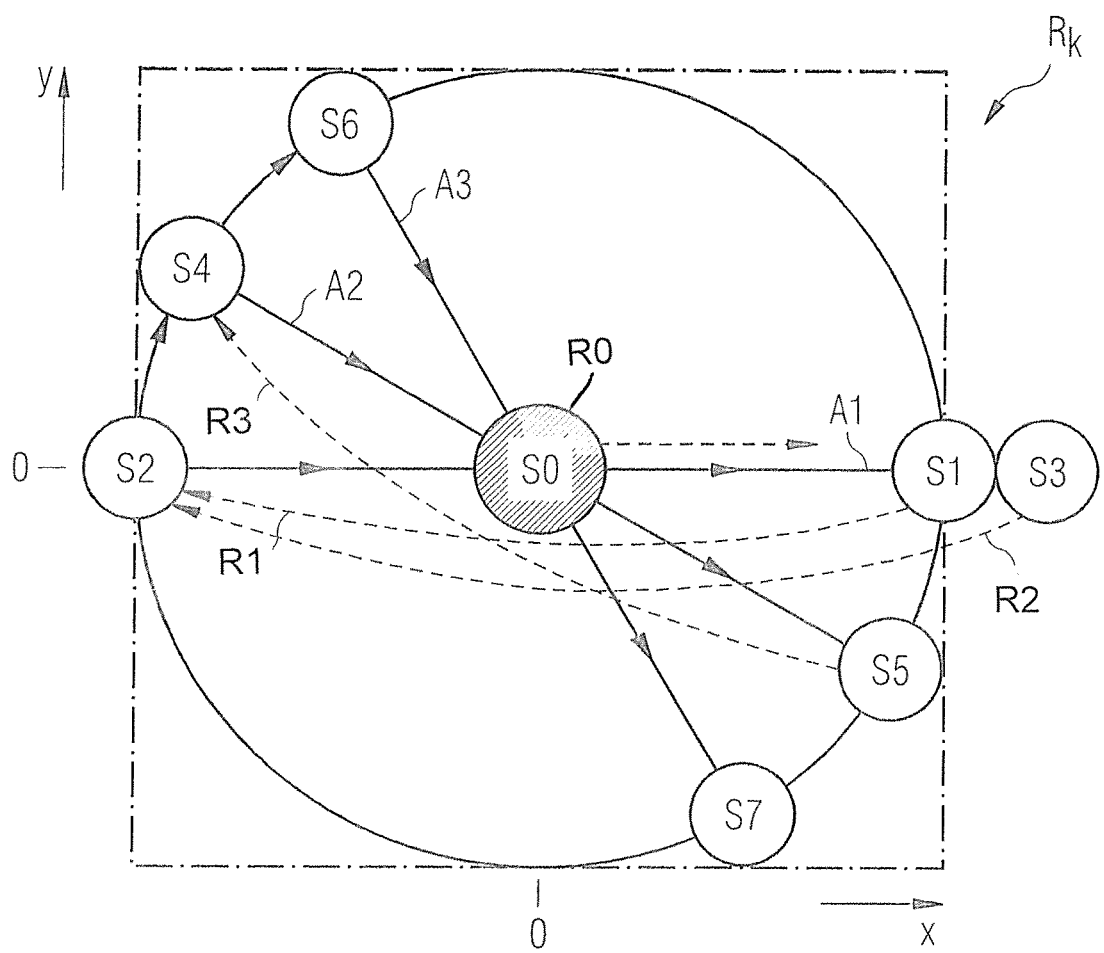
FIG. 5 schematically depicts k-space trajectory node points and k-space trajectories for a radial TSE sequence.

Typical positions of k-space trajectory node points S1, S2, S3, . . . , S7 in k-space $R_k$ are shown for different pulse sequence types in FIGS. 3 through 5.

The pulse sequence in FIG. 3 is a simple EPI sequence. The node points S1, S2, S3, S4, S5, . . . are reached in succession and the raw data are respectively acquired between the node points S1, S2, and S3, S4, as well as S 5, . . . etc. in order to scan the entirety of k-space $R_k$ with sufficient density, line by line, along the x-direction.

FIG. 4 is a schematic depiction of a turbo spin echo sequence which likewise scans k-space $R_k$ line by line in the x-direction. Here as well, the individual node points S1, S2, S3, S4, S5, S6, S7 are also taken up in succession. The method proceeds in a similar manner given the radial turbo spin echo sequence according to FIG. 5, but Cartesian scanning is not implemented, and instead a scan along radial spokes, which travel through the k-space center, is implemented.

It can be seen that, to reach the individual node points S1, S2, S3, S4, S5, S6, S7, . . . in the correct order, the matching gradients must be switched and further events (for example radio-frequency pulses) must additionally take place that are respectively linked with the individual points or, respectively, paths. This is explained below.

System specification parameters AP are initially imported in Step III. For example, these could be stored in the memory 16 of the system or in a memory 26 within the terminal 19. As mentioned above, these system specification parameters AP are advantageously limit values that may not be exceeded by the pulse series, in particular a maximum gradient amplitude and a maximum slew rate.

In Step IV, auxiliary gradient moments M can then be calculated on the basis of the control protocol parameter values, in particular the sequence type. These additional gradient moments are spoiler or crusher gradients in defined sequences, for example.

Insofar as control protocol parameter values that are provided in the control protocol should be adopted without modification, in Step IX the precise timing for the node points could then be calculated immediately, meaning that node point times for the individual node points that specify at which point in time precisely which node point is to be reached could be calculated on the basis of the predetermined echo times and repetition times.

However, the operator preferably should still be given the opportunity to modify specific parameter values, in particular echo time, repetition time, resolution, bandwidth etc. Steps V, VI, VII, VIII are therefore optionally implemented first before Step IX.

In Step V, a calculation initially takes place of possible minimum node point times t1', t2', . . . , t7' for the k-space trajectory node points. In particular, when certain node points can be reached in the fastest possible case is hereby determined under consideration of the system specification parameter values. It is normally assumed that maximum allowable slew rates and maximum allowable gradient amplitudes are used in order to arrive from one node point to the next node point in k-space as quickly as possible.

If these minimum possible node point times are known, the allowable adjustable parameter value ranges SPB for the individual control protocol parameters (thus for example the possible echo times, repetition times etc.) can be determined from these in Step VI.

The possible parameter value ranges SPB that are determined in such a manner are then output to a user interface 30 of the terminal 19 in Step VII, and matching parameter value change commands SPU of the user are imported at the user interface 30. For example, in addition to a monitor at which the parameter value ranges SPB are displayed, the user interface 30 could have a pointer device with which a virtual slide controller is adjusted within the permissible ranges. For example, the transmission of the possible adjustable parameter ranges SPB and the acceptance of the parameter value change commands SPU can take place via an interface 22 of the pulse sequence determination device 20 which controls the user interface 30 accordingly for this (see FIG. 1)

If the user has changed at least one of the control protocol parameter values by means of a parameter value change command SPU, in Step VIII a check is made as to whether a change of the node points is also required in connection with this. For example, this could be the case if the user desires a higher resolution, since then the node points shift further out from the k-space center, and in general longer times are required between the points.

If a change of the node points is required ("y" branch), the workflow jumps back to Step II, and new node points in k-space are established or, respectively, some of the node points are changed. Steps III, IV, V, VI, VII and VIII are then subsequently passed through again.

If no change to the node points is required ("n" branch), in Step IX the precise timing of the trajectories in k-space $R_k$ can then be calculated as explained above, meaning that the individual node point times t1, t2, . . . , t7 can be determined at which the individual k-space trajectory node points S1, S2, S3, . . . , S7 must be reached under the given control protocol parameter values, in particular under the given echo times and repetition times.

The calculation of these node point times takes place based on predetermined rules defined for the individual sequence types, which rules can be stored in a memory 26, for example. In particular, these times result from the readout bandwidth and the resolution.

It is noted again that dependencies and effects exist between the individual node points, such that a subsequent point (for example) can also be defined by a preceding point and additional specification of the difference values with regard to the node point time and with regard to the spatial arrangement in k-space (for example in x-, y-coordinates). The number of node points to be established can thereby also be minimized.

The precise trajectories and gradient curves can then be calculated in Step X. For example, this can take place in a pulse determination unit 24 which accepts previously determined node points from the trajectory node point determination unit 23 (see FIG. 1). Thus pulse determination unit can also access rules in the memory 26, according to which the gradient curves are then calculated depending on the k-space trajectory node points and their associated node point times. For example, for this the pulse determination unit can use an arbitrary optimization method (for example a spline optimization method as noted)—under consideration of the node points and their times as well as the gradient moments required between these node points as boundary conditions—in order to generate optimally smooth gradient pulses with low slew rates. Unnecessarily steep gradient ramps or the stringing along of different gradients from different events can therefore be avoided, which is different than in the previous sequence determination methods. Not only is the noise exposure thereby reduced, but a lower power consumption, less heating and therefore reduced helium boil-off in the gradient coils are also achieved. Under the circumstances, it is then even possible to design gradient coils more cost-effectively.

As explained above, the individual k-space trajectory node points are normally linked with specific events, for example the emission of defined radio-frequency pulses and/or the release of reception devices so that raw data are acquired along a trajectory between two node points. Some radio-frequency pulses serve as pure excitation pulses in order to excite a defined volume (for example one or more slices); other radio-frequency pulses serve in turn as refocusing pulses that are also linked with a jump (discontinuity) in k-space. Insofar as they should act in spatially selective manner, these radio-frequency pulses must normally also be linked with gradient amplitudes switched simultaneously or in parallel (transverse to the slice plane, thus for example in the z-direction if the slice plane extends in an x/y-plane). The respective strength or amplitudes of the gradient pulses result from the bandwidth and the slice thickness to be excited.

In the following, various timing scenarios are explained as examples using FIGS. 3 through 5. FIGS. 3 through 5 thereby respectively show as a roughly schematic depiction only the first k-space trajectory node points within acquisition k-space $R_k$. These k-space trajectory node points are normally situated much more densely, for example as prescribed by the Nyquist condition. The events (such as the emission of radio-frequency pulses) taking place in parallel in transmission k-space should be depicted via corresponding additional reference characters at the individual points and paths, as well as via the dashed lines, such that the individual functions and the timing become clearer. A slice in k-space $R_k$ that extends in an x/y-plane is respectively shown. In all shown pulse sequences, the start point is respectively the k-space center, meaning that the first k-space trajectory node point S0 is spatially situated in the middle (at the coordinates 0, 0) of k-space $R_k$, and the associated node point time is t=0.

The exemplary embodiment presented in FIG. 3 is a very simple EPI sequence. The first k-space trajectory node point S0 here is linked with a radio-frequency pulse event R0. This radio-frequency pulse event R0 is the emission of (for example) a 90° radio-frequency pulse with simultaneous switching of a gradient. This gradient here travels in the z-direction (i.e. orthogonal to the image plane shown in FIGS. 3 through 5) since a very definite slice (namely the slice for which k-space is shown) with a defined width should be selectively excited. The readout of the magnetic resonance signals from this slice then takes place line by line, beginning at the k-space trajectory node point S1 which is reached first (shown by the dashed arrow). K-space is subsequently traversed in the x-direction up to the k-space trajectory node point S2 via a corresponding switching of the gradient in the x-direction, wherein this trajectory is linked with a readout event A1 (meaning that a readout window is switched in parallel).

If the k-space trajectory node point S2 is reached, this readout window is ended, meaning that the ADCs are predominantly deactivated. The switching of a y-gradient then takes place in order to reach the node point S3 in the y-direction. If node point S3 is reached, a movement through k-space $R_k$ in the x-direction to the node point S4 takes place again via switching of corresponding x-gradients, wherein the intervening k-space trajectory is again linked with a readout event A2, meaning that a new readout window is switched between the node points S3 and S4. The readout window is then ended again at the node point S4, and a traversal of k-space in the y-direction to the next node point S5 takes place etc.

FIG. 4 shows a TSE sequence in which readout likewise takes place line by line. Here as well, a radio-frequency pulse event R0 in the form of a 90° excitation pulse is initially emitted at the node point S0 in the k-space center (thus with deactivated x- and y-gradients) with simultaneous switching of a z-gradient in order to excite a defined slice with a defined width in the z-direction.

A transition to the next node point S1 (which is shown by the dashed arrow) then subsequently takes place without an additional action occurring. The node point S1 is initially linked with an additional radio-frequency pulse event R1. This is the emission of a slice-selective 180° refocusing pulse, possibly also via switching of a corresponding z-gradient. This leads to the situation that the spins flip over in the x-direction, which is linked with a change of the algebraic sign in the x-direction in k-space. This is symbolized by the dashed arrow to the next node point S2, which dashed arrow is linked with the reference character R1. A switching of gradients in the x-direction then takes place so that the trajectory is traversed between the node point S2 and the node point S3. The node point S3 should be spatially situated at the same point as the node point S1. This is symbolized by a close superposition of these two node points S1, S3 in FIG. 4. A readout window is switched simultaneously on the path between the node point S2 and the node point S3, meaning that this trajectory is linked with a readout event A1. If the node point S3 is reached, the corresponding line is k-space has been read out in the x-direction.

The node point S3 is linked with a radio-frequency pulse event R2, namely just like the node point S1 is linked with a radio-frequency pulse of 180°. This leads again to a change of the algebraic sign, i.e. a return to the node point S2 in k-space $R_k$. However, a gradient in the y-direction is now switched simultaneously or immediately afterward so that the node point S4 is reached overall.

A readout window is switched again between the node point S4 and the subsequent node point S5 which is reached via corresponding switching of gradients in the x-direction along the trajectory between S4 and S5, such that this trajectory is linked with a readout event A2 and corresponding raw data are acquired along this path in k-space.

The node point S5 is linked with an additional radio-frequency event R3, wherein it is again a 180° refocusing pulse (that acts in a slice-selective manner via switching of a parallel z-gradient) and a simultaneous or immediately following switching of a y-gradient, such that a return to the node point S4 and a (possibly simultaneous) travel to the next node point S6 take place. Starting from S6, the next trajectory then takes place in the x-direction, which is linked with an additional readout event A3 etc.

Here k-space is also scanned in this manner line by line in the x-direction.

FIG. 5 shows an additional TSE sequence which functions similar to the TSE sequence in FIG. 4, but with the difference that now the readout takes place along radial trajectories through the k-space center. This has the advantage that the k-space center which includes the most important information is read out multiple times. However, the subsequent evaluation of the data or reconstruction of the image data is somewhat more complicated since the acquired raw data must normally first be resorted.

This sequence also begins again with a radio-frequency pulse event R0 which is linked with the start node point S0 in the k-space center, wherein a defined slice with a defined width is excited slice-selectively in the z-direction. In principle, this can hereby be the same pulse as in the exemplary embodiment according to FIG. 4. A transition to the node point S1 then likewise takes place, at which node point S1 a slice-selective refocusing pulse of 180° is emitted again as a radio-frequency pulse event linked with said node point S1, which leads to a flipping of the spins in the x-direction (and thus to a transition to the next node point S2).

By switching an x-gradient, the trajectory is then again traveled between the node point S2 and the subsequent node point S3, which is identical to the node point S1 with regard to the spatial coordinates and differs only with regard to the node point time. A readout window is switched again along this trajectory, meaning that the trajectory is linked with a readout event A1.

The node point S3 is also again linked with a radio-frequency pulse event R2 in the form of a slice-selective refocusing pulse, such that a return to the node point S2 takes place again, wherein gradients are switched immediately or directly afterward in the x-direction and y-direction, such that the node point S4 is reached. The switching of the gradients in the x-direction and y-direction takes place so that the trajectory follows a circuit between the node points S2 and S4.

Furthermore, gradients are subsequently switched in coordination in the x-direction and y-direction so that a straight radial trajectory (a spoke) is traversed through the k-space center to the next node point S5. This trajectory is linked with an additional readout event A2, namely the switching of an additional readout window, such that raw data are acquired along this radial trajectory.

The node point S5 is in turn linked with an additional radio-frequency pulse event R3 in the form of a selective refocusing pulse of 180° in the z-direction, such that here as well as flipping of the spins back to the node point S4 takes place in the x/y-plane, wherein additional x- and y-gradients are switched in parallel or directly afterward so that the node point S6 is subsequently reached. From the node point S6, additional gradients are switched in the x-direction and y-direction so that the next radial trajectory will travel through the k-space center to the node point S7, which is linked with an additional readout event A3 (i.e. the switching of an additional readout window), etc.

Figure 2:
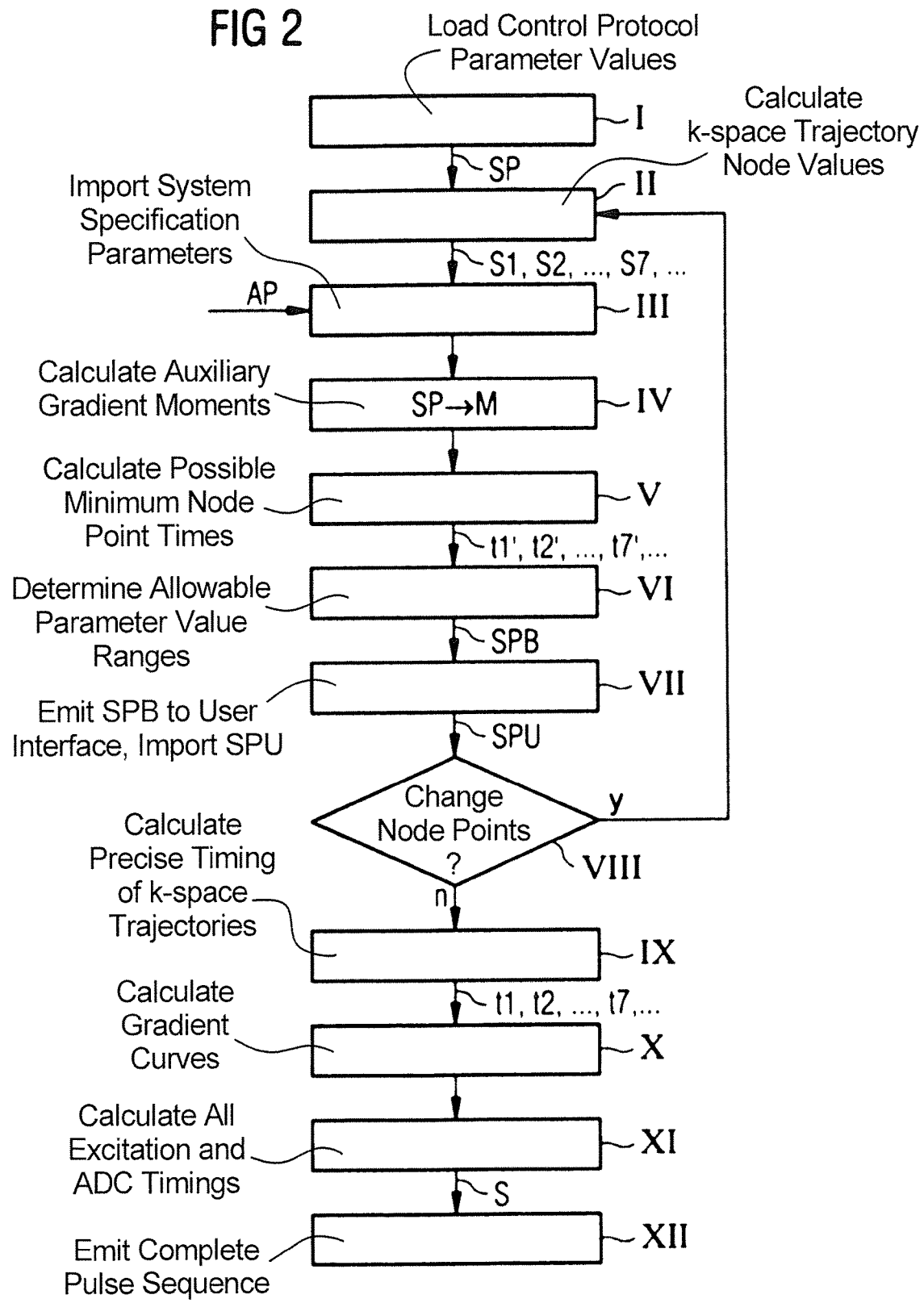
FIG. 2 is a flowchart of an exemplary embodiment of the method according to the invention to determine a pulse sequence.

The entire calculation of the excitation and ADC timings that is required for this—i.e. the calculation of which radio-frequency pulses must be switched parallel to which z-gradients and which readout windows must be switched at precisely which points in time—takes place in Step XI (see FIG. 2).

As soon as these calculations have taken place, the complete pulse sequence S is created and can then be output again (for example in Step XII) via a pulse sequence interface 25, and can be passed to the measurement control unit 15 (for example via the terminal interface 17 in the case shown in FIG. 1) so that the measurement then runs fully automatically. Alternatively, this pulse sequence can naturally be cached in a memory and be used later.

As mentioned above, the pulse sequence determination device 20 can preferably be realized in the form of software components on a suitable microprocessor or multiple linked microprocessors of the terminal 19. This realization particularly preferably takes place in the form of a scripting language. This means that the interfaces 21, 22, 25—and in particular the trajectory node point determination unit 23 and the pulse determination unit 24—are created in the form of scripting language modules and linked in a script in a suitable manner so that an operator can not only view this script with the use of the user interface 30 of the terminal, but also can possibly manually modify the script. The user then not only has the possibility to change individual parameter values, but also can directly, manually place individual node points in k-space or even change calculation methods in order to thus be able to subsequently, automatically create the optimal pulse sequence for the currently pending task in a simple manner.

It is noted again that the methods and designs described in detail in the preceding are only exemplary embodiments, and that the basic principle can also be varied within a wide range by those skilled in the art without departing from the scope of the invention. For example, the pulse sequence determination device 20 can also be realized as part of the control device 10 itself—in particular even as a component of the measurement control unit 15—instead of at the terminal. The pulse sequence determination device could likewise also be realized at a separate computer system which, for example, is linked with the magnetic resonance system via the network NW. The term "unit" or "module" does not preclude formation thereof by multiple components that can possibly also be spatially distributed.

Although modifications and changes may be suggested by those skilled in the art, it is the intention of the inventors to embody within the patent warranted hereon all changes and modifications as reasonably and properly come within the scope of their contribution to the art.

We claim as our invention:

1. A method to determine a pulse sequence for operating a magnetic resonance system, comprising:
    providing control protocol parameters to a processor that define operational features of said magnetic resonance system in order to acquire magnetic resonance data from a subject, said control protocol parameters being selected from the group consisting of a sequence type of a pulse sequence for operating said magnetic resonance system to acquire said magnetic resonance data from the subject, an echo time in said pulse sequence, a repetition time of said pulse sequence, a resolution of said magnetic resonance data, a readout bandwidth of said magnetic resonance data, and a target magnetization of nuclear spins in the subject;
    in said processor, automatically determining, dependent on said control protocol parameter values, a plurality of k-space trajectory node points of a trajectory that will be traversed in k-space in order to enter said magnetic resonance data into k-space, said trajectory comprising a plurality of trajectory branches that are successively traversed in said trajectory, each branch having a starting point in k-space and an ending point in k-space and each node point coinciding with one of the respective starting points or ending points; and
    in said processor, for each k-space trajectory node point, determining a node point time associated therewith that is a time, following a start of said trajectory, at which said magnetic resonance data are entered at the respective k-space trajectory node point, dependent on at least some of said control parameter values;
    in said processor, determining respective k-space trajectories, and curves of a gradient pulse series, needed to reach the respective k-space trajectory node point at the respective trajectory node point time associated therewith; and
    in said processor, determining said pulse sequence for operating said magnetic resonance system based on said plurality of k-space trajectory node points and said curves of said gradient pulse series, and making said pulse sequence available at an output of said processor in electronic form with a format for operating said magnetic resonance system.

2. A method as claimed in claim 1 comprising selecting at least some of said k-space trajectory node points to coincide with a time of occurrence at least one defined event in the operation of said magnetic resonance system selected from the group consisting of emission of a radio-frequency pulse and activating a readout gradient during which said magnetic resonance data are acquired from the subject.

3. A method as claimed in claim 1 comprising providing said processor with system specification parameter values that define physical attributes of said magnetic resonance system and, in said processor, determining said pulse sequence also dependent on said system specification parameter values.

4. A method as claimed in claim 1 comprising providing said processor, as one of said protocol parameter values, with a designation of a sequence type for said pulse sequence, said sequence type requiring auxiliary gradient moments for gradient pulses in said pulse sequence, and determining said pulse sequence in said processor also dependent on said auxiliary gradient moments.

5. A method as claimed in claim 1 comprising, in said processor, after determining said k-space trajectory node points then determining, for each k-space trajectory node point:
    (a) a minimum of the k-space trajectory node point time respectively associated therewith;
    (b) determine adjustable parameter value ranges for at least one of said control protocol parameter values;
    (c) present the adjustable parameter value ranges at a display monitor in communication with said processor and thereafter detecting change commands entered into said processor that change any of said control protocol parameter values;

(d) checking each minimum node point time dependent on any changed control protocol parameter values to obtain a check result;

if said check result indicates any of said possible minimum node point times is not achievable, repeating (a), (b), (c) and (d); and if said check result indicates said minimum node point times are achievable, determining said pulse sequence based on said k-space trajectory node points respectively associated with the possible minimum node point times.

6. A method as claimed in claim 1 comprising entering said k-space trajectory node points via a user interface of said processor.

7. A method as claimed in claim 1 comprising, in said processor, determining at least one of said pulse sequence and said k-space trajectory node points using a programming language that is independent of said magnetic resonance system.

8. A method as claimed in claim 1 comprising, in said processor, determining at least one of said pulse sequence and said k-space trajectory node points using a scripting language.

9. A method to operate a magnetic resonance system, comprising:

providing control protocol parameters to a processor that define operational features of said magnetic resonance system in order to acquire magnetic resonance data from a subject, said control protocol parameters being selected from the group consisting of a sequence type of a pulse sequence for operating said magnetic resonance system to acquire said magnetic resonance data from the subject, an echo time in said pulse sequence, a repetition time of said pulse sequence, a resolution of said magnetic resonance data, a readout bandwidth of said magnetic resonance data, and a target magnetization of nuclear spins in the subject;

in said processor, automatically determining, dependent on said control protocol parameter values, a plurality of k-space trajectory node points of a trajectory that will be traversed in k-space in order to enter said magnetic resonance data into k-space, said trajectory comprising a plurality of trajectory branches that are successively traversed in said trajectory, each branch having a starting point in k-space and an ending point in k-space and each node point coinciding with one of the respective starting points or ending points; and in said processor, for each k-space trajectory node point, determining a node point time associated therewith that is a time, following a start of said trajectory, at which said magnetic resonance data are entered at the respective k-space trajectory node point, dependent on at least some of said control parameter values;

in said processor, determining respective k-space trajectories, and curves of a gradient pulse series, needed to reach the respective k-space trajectory node point at the respective trajectory node point time associated therewith;

in said processor, determining said pulse sequence for operating said magnetic resonance system based on said plurality of k-space trajectory node points and said curves of said gradient pulse series, and making said pulse sequence available at an output of said processor in electronic form with a format for operating said magnetic resonance system; and operating said magnetic resonance system according to said pulse sequence.

10. A pulse sequence determination device for determining a pulse sequence to operate a magnetic resonance system, said pulse sequence determination device comprising:

a processor having an interface provided with control protocol parameters that define operational features of said magnetic resonance system in order to acquire magnetic resonance data from a subject, said control protocol parameters being selected from the group consisting of a sequence type of a pulse sequence for operating said magnetic resonance system to acquire said magnetic resonance data from the subject, an echo time in said pulse sequence, a repetition time of said pulse sequence, a resolution of said magnetic resonance data, a readout bandwidth of said magnetic resonance data, and a target magnetization of nuclear spins in the subject;

said processor being configured to determine, dependent on said control protocol parameter values, a plurality of k-space trajectory node points of a trajectory that will be traversed in k-space in order to enter said magnetic resonance data into k-space, said trajectory comprising a plurality of trajectory branches that are successively traversed in said trajectory, each branch having a starting point in k-space and an ending point in k-space and each node point coinciding with one of the respective starting points or ending points;

being configured to determine said processor, for each k-space trajectory node point, a node point time associated therewith that is a time, following a start of said trajectory, at which said magnetic resonance data are entered at the respective k-space trajectory node point, dependent on at least some of said control parameter values;

said processor being configured to determine respective k-space trajectories, and curves of a gradient pulse series, needed to reach the respective k-space trajectory node point at the respective trajectory node point time associated therewith; and said processor being configured to determine said pulse sequence for operating said magnetic resonance system based on said plurality of k-space trajectory node points and said curves of said gradient pulse series, and to make said pulse sequence available at an output of said processor in electronic form with a format for operating said magnetic resonance system.

11. A magnetic resonance system comprising:

a magnetic resonance data acquisition unit comprising a radio-frequency transmission device, a gradient system, a control device, and a pulse sequence determination device;

said pulse sequence determination device comprising:

a processor having an interface provided with control protocol parameters that define operational features of said magnetic resonance system in order to acquire magnetic resonance data from a subject, said control protocol parameters being selected from the group consisting of a sequence type of a pulse sequence for operating said magnetic resonance system to acquire said magnetic resonance data from the subject, an echo time in said pulse sequence, a repetition time of said pulse sequence, a resolution of said magnetic resonance data, a readout bandwidth of said magnetic resonance data, and a target magnetization of nuclear spins in the subject;

said processor being configured to determine, dependent on said control protocol parameter values, a plurality of k-space trajectory node points of a trajectory that will be traversed in k-space in order to enter said magnetic resonance data into k-space, said trajectory comprising a plurality of trajectory branches that are successively traversed in said trajectory, each branch having a starting point in k-space and an ending point in k-space and each node point coinciding with one of the respective starting points or ending points;

said processor being configured to determine, for each k-space trajectory node point, a node point time associated therewith that is a time, following a start of said trajectory, at which said magnetic resonance data are entered at the respective k-space trajectory node point, dependent on at least some of said control parameter values;

said processor being configured to determine respective k-space trajectories, and curves of a gradient pulse series, needed to reach the respective k-space trajectory node point at the respective trajectory node point time associated therewith., said processor being configured to determine said pulse sequence for operating said magnetic resonance system based on said plurality of k-space trajectory node points and said curves of said gradient pulse series, and to make said pulse sequence available at an output of said processor in electronic form with a format for operating said magnetic resonance system; and said control device being configured to operate said radio-frequency transmission device and said gradient system of said data acquisition unit according to said pulse sequence.

12. A non-transitory, computer-readable data storage medium encoded with programming instructions, said storage medium being loaded into a processor for determining a pulse sequence to operate a magnetic resonance system, and said programming instructions causing said processor to:

receive control protocol parameters that define operational features of said magnetic resonance system in order to acquire magnetic resonance data from a subject, said control protocol parameters being selected from the group consisting of a sequence type of a pulse sequence for operating said magnetic resonance system to acquire said magnetic resonance data from the subject, an echo time in said pulse sequence, a repetition time of said pulse sequence, a resolution of said magnetic resonance data, a readout bandwidth of said magnetic resonance data, and a target magnetization of nuclear spins in the subject;

determine, dependent on said control protocol parameter values, a plurality of k-space trajectory node points of a trajectory that will be traversed in k-space in order to enter said magnetic resonance data into k-space, said trajectory comprising a plurality of trajectory branches that are successively traversed in said trajectory, each branch having a starting point in k-space and an ending point in k-space and each node point coinciding with one of the respective starting points or ending points;

determine, for each k-space trajectory node point, a node point time associated therewith that is a time, following a start of said trajectory, at which said magnetic resonance data are entered at the respective k-space trajectory node point, dependent on at least some of said control parameter values;

determine respective k-space trajectories, and curves of a gradient pulse series, needed to reach the respective k-space trajectory node point at the respective trajectory node point time associated therewith; and determine said pulse sequence for operating said magnetic resonance system based on said plurality of k-space trajectory node points and said curves of said gradient pulse series, and make said pulse sequence available at an output of said processor in electronic form with a format for operating said magnetic resonance system.

* * * * *